(12) United States Patent
Boskamp et al.

(10) Patent No.: US 7,088,100 B2
(45) Date of Patent: Aug. 8, 2006

(54) METHOD AND APPARATUS TO GENERATE A CIRCULAR POLARIZED RF FIELD INDEPENDENT OF SUBJECT ASYMMETRY

(75) Inventors: Eddy B. Boskamp, Menomonee Falls, WI (US); Armen Kocharian, Brookfield, WI (US); LeRoy Blawat, Milwaukee, WI (US)

(73) Assignee: General Electric Company, Schenectady, NY (US)

( * ) Notice: Subject to any disclaimer, the term of this patent is extended or adjusted under 35 U.S.C. 154(b) by 118 days.

(21) Appl. No.: 10/708,567

(22) Filed: Mar. 11, 2004

(65) Prior Publication Data

US 2005/0200358 A1 Sep. 15, 2005

(51) Int. Cl.
G01V 3/00 (2006.01)
(52) U.S. Cl. ...................................... 324/318; 324/309
(58) Field of Classification Search ................ 324/318, 324/319, 322, 309, 307, 312, 300; 600/400
See application file for complete search history.

(56) References Cited

U.S. PATENT DOCUMENTS

| | | | |
|---|---|---|---|
| 4,638,253 A * | 1/1987 | Jaskolski et al. ........... 324/311 |
| 5,256,971 A | 10/1993 | Boskamp | |
| 5,361,765 A | 11/1994 | Herlihy et al. | |
| 5,363,845 A | 11/1994 | Chowdhury et al. | |
| 5,370,118 A | 12/1994 | Vij et al. | |
| 5,594,337 A | 1/1997 | Boskamp | |
| 5,696,449 A | 12/1997 | Boskamp | |
| 6,008,649 A | 12/1999 | Boskamp et al. | |
| 6,060,882 A * | 5/2000 | Doty ........................... 324/318 |
| 6,140,900 A * | 10/2000 | Crozier et al. .............. 335/299 |
| 6,232,779 B1 | 5/2001 | Tropp et al. | |
| 6,249,121 B1 | 6/2001 | Boskamp et al. | |
| 6,313,633 B1 | 11/2001 | Boskamp | |
| 6,318,734 B1 | 11/2001 | Boskamp | |
| 6,369,550 B1 | 4/2002 | Lou et al. | |
| 6,377,148 B1 * | 4/2002 | Forbes et al. ............... 335/301 |
| 6,404,201 B1 | 6/2002 | Boskamp | |
| 6,411,090 B1 | 6/2002 | Boskamp | |
| 6,437,567 B1 | 8/2002 | Schenck et al. | |
| 6,459,265 B1 | 10/2002 | Lou et al. | |
| 6,487,436 B1 | 11/2002 | Boskamp et al. | |
| 6,498,947 B1 | 12/2002 | Boskamp et al. | |
| 6,522,144 B1 | 2/2003 | Boskamp | |
| 6,534,983 B1 | 3/2003 | Boskamp et al. | |
| 6,538,442 B1 | 3/2003 | Boskamp | |
| 6,563,315 B1 | 5/2003 | Boskamp et al. | |
| 6,590,392 B1 | 7/2003 | Boskamp et al. | |
| 6,608,480 B1 * | 8/2003 | Weyers ....................... 324/318 |
| 6,639,406 B1 | 10/2003 | Boskamp et al. | |
| 6,720,768 B1 * | 4/2004 | Crozier et al. .............. 324/318 |

* cited by examiner

*Primary Examiner*—Brij B. Shrivastav
(74) *Attorney, Agent, or Firm*—Ziolkowski Patent Solutions Group, SC; Michael A. Della Penna; Carl B. Horton

(57) ABSTRACT

An RF coil assembly is presented that incorporates balun networks to eliminate standing waves from cables used to apply a voltage to multiple drive ports of the coil. Each drive port is driven by an applied voltage that is shifted 90 degrees in the tangential direction. Further, all drive ports are located on one end-ring of the coil, e.g. the superior end-ring. The inequality of the efficiency of the drive ports is reduced such that a substantially circular polarization in the volume of the coil is maintained. The present invention reduces asymmetrical loading by a patient as a result of patient asymmetry and patient contact with the opposite end-ring of the coil that normally negatively affects circular polarization and conventional coil configurations.

23 Claims, 3 Drawing Sheets

METHOD AND APPARATUS TO GENERATE A CIRCULAR POLARIZED RF FIELD INDEPENDENT OF SUBJECT ASYMMETRY

BACKGROUND OF INVENTION

The present invention relates generally to MR imaging and, more particularly, to a method and apparatus to generate a substantially circular polarized RF field about a subject independent of subject asymmetry.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The use of RF coils to generate an RF field about the bore of a magnet for imaging is known in the art of nuclear magnetic resonance imaging. Generally, a patient or other imaging subject is positioned on an examination table and inserted into a coil arrangement having a cylindrical bore therethrough. The RF coils extend around the bore and when energized, transmits and/or receives RF energy. In addition to whole body coils, it is known to utilize anatomically directed coils for imaging targeted anatomical regions of a patient. For instance, head coils have been developed and are specifically designed to image the head of a patient.

Head coils, as well as other coils in which the coil elements are arranged in a birdcage arrangement, are generally cylindrical and are designed to generate a substantially circular polarized RF field inside the volume of the coil. With a symmetrical polarized field, the center of the coil, perpendicular to the axis of the coil elements, is typically considered as a virtual electrical ground plane. However, when a patient is placed in the volume of the coil, the asymmetry of the patient will shift the ground plane of the coil and therefore the center of the coil may no longer be relied upon as a good grounding location. That is, the human body is asymmetric and generally distorts the symmetry of the coil especially when only a portion of the patient is positioned within the coil.

Further, in the context of head coils, the shoulders of a patient are placed in contact with the head coil assembly. Such contact may also affect the symmetry created within the volume of the head coil. It is also recognized that at higher frequency imaging, the asymmetries inherent in the human body impact the symmetry of the polarized field within the coil and will worsen since with higher frequency imaging coupling to the patient increases. Moreover, the otherwise substantially circular symmetry of the RF field created within the volume of the coil may also become distorted, and drive ports connected to the coil that are driven at voltages out of phase to one another by 90 degrees, are no longer shifted properly when the coil is loaded with a patient. Hence, quadrature isolation is destroyed as is efficiency resulting in a decrease in SNR as well as an increase in SAR.

A volume coil having sixteen coil elements with a center ground plane is illustrated in FIG. 1. As schematically shown, coil 2 includes an array of coil elements 3 that are uniformly spaced from one another and designed to create a substantially circular polarized field when oriented in a cylindrical arrangement. As mentioned above, with a conventional birdcage coil 2, a center of the coil 4 is considered as the virtual ground. The coils are driven through the application of voltages at two tangentially 90 degree apart drive ports 5, 6. Extending from each drive port 5, 6 is a drive cable 7,8, respectively, The drive cable 7 connected to drive port 5 extends to the superior end-ring 9 of the coil 2, and drive cable 8 extends from drive port 6 to the inferior end-ring 10. The drive voltage applied at drive port 6 is 90 degrees shifted in phase from the voltage applied at drive port 5 so as to set up, absent patient induced asymmetry, the generally circular polarized field inside the volume of the coil. Each drive cable 7, 8 is physically soldered to the substrate of the coil 2 with their shields contacting the center of the coil. The center of the coil 2 is considered the virtual ground, thus killing all standing waves on the cable shield. Notwithstanding the benefits of such a coil design, as noted above, the patient asymmetry may impact the symmetry of the circularized polarized field otherwise created within coil 2. As a result, the field may become more linear than circular thereby introducing shading to reconstructed images. Moreover, with decreased circularity in the polarized field, the power requirements of the coil also increase. Additionally, the linearity resulting in the volume of the coil creates localized high energy fields within the coil volume thereby increasing temperature differentiation across the coil volume.

It would therefore be desirable to have a system and method capable of generating a substantially circular polarized RF field independent of subject asymmetry or incidental subject contact with an RF coil assembly during data acquisition.

BRIEF DESCRIPTION OF INVENTION

The present invention is directed to a method and apparatus of generating a substantially circular polarized RF field independent of subject symmetry or incidental subject contact with an RF coil assembly that overcomes the aforementioned drawbacks.

An RF coil assembly is presented that incorporates balun networks to eliminate standing waves from cables used to apply a voltage to multiple drive ports of the coil. Each drive port is driven by an applied voltage that is shifted 90 degrees in the tangential direction. Further, all drive ports are located on one end-ring of the coil, e.g. the superior end-ring. As a result, the coil will be asymmetrically loaded by a patient as a result of patient asymmetry and patient contact with the opposite end-ring of the coil. This asymmetry negatively affects circular polarization and conventional coil configurations, but with the present invention, the inequality of the efficiency of the drive ports is reduced such that a substantially circular polarization in the volume of the coil is maintained independent of the asymmetry.

Therefore, in accordance with one aspect of the present invention, an MR coil assembly is provided that includes a volume coil arrangement situated to generate a polarized field about a subject to be imaged. The coil assembly further includes multiple drive ports connected to a common end of the volume coil arrangement as well as multiple drive cables connected to a voltage source at one end and connected to the multiple drive ports at another end to apply voltages to the multiple drive ports. In this manner, the volume coil arrangement generates a substantially circular polarized field independent of subject asymmetry.

In accordance with another aspect of the invention, an MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The RF coil assembly includes a plurality of RF coils arranged in a birdcage arrangement to acquire MR data from the subject at least partially positioned in a volume-of-interest. The coil assembly further includes a number of drive ports to receive an applied voltage to drive the plurality of RF coils to maintain a substantially circular polarized field about the volume-of-interest irrespective of possible subject contact with the RF coil assembly.

According to another aspect, the present invention includes a method of driving coils of an MR coil assembly to maintain a polarized RF field independent of subject asymmetry. The method includes the steps of providing a pair of voltage inputs and splitting each voltage input into a pair of driving inputs. The method also includes the steps of inputting each driving input into a balun and inputting an output of each balun to a respective MR coil drive port of an MR coil assembly for generation of an RF field about a volume-of-interest.

Various other features, objects, and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
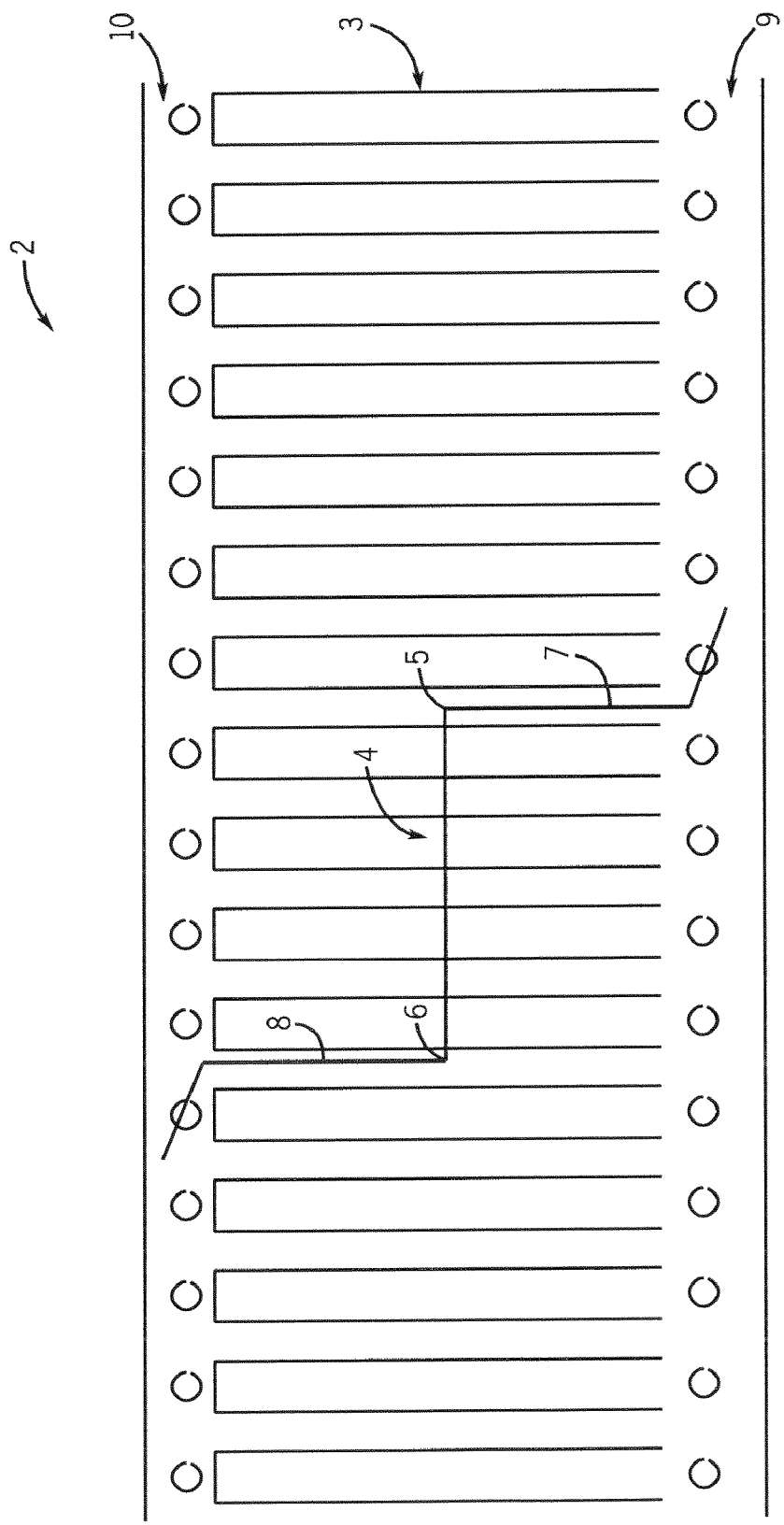
FIG. 1 is a schematic of a known MR coil assembly.
Figure 2:
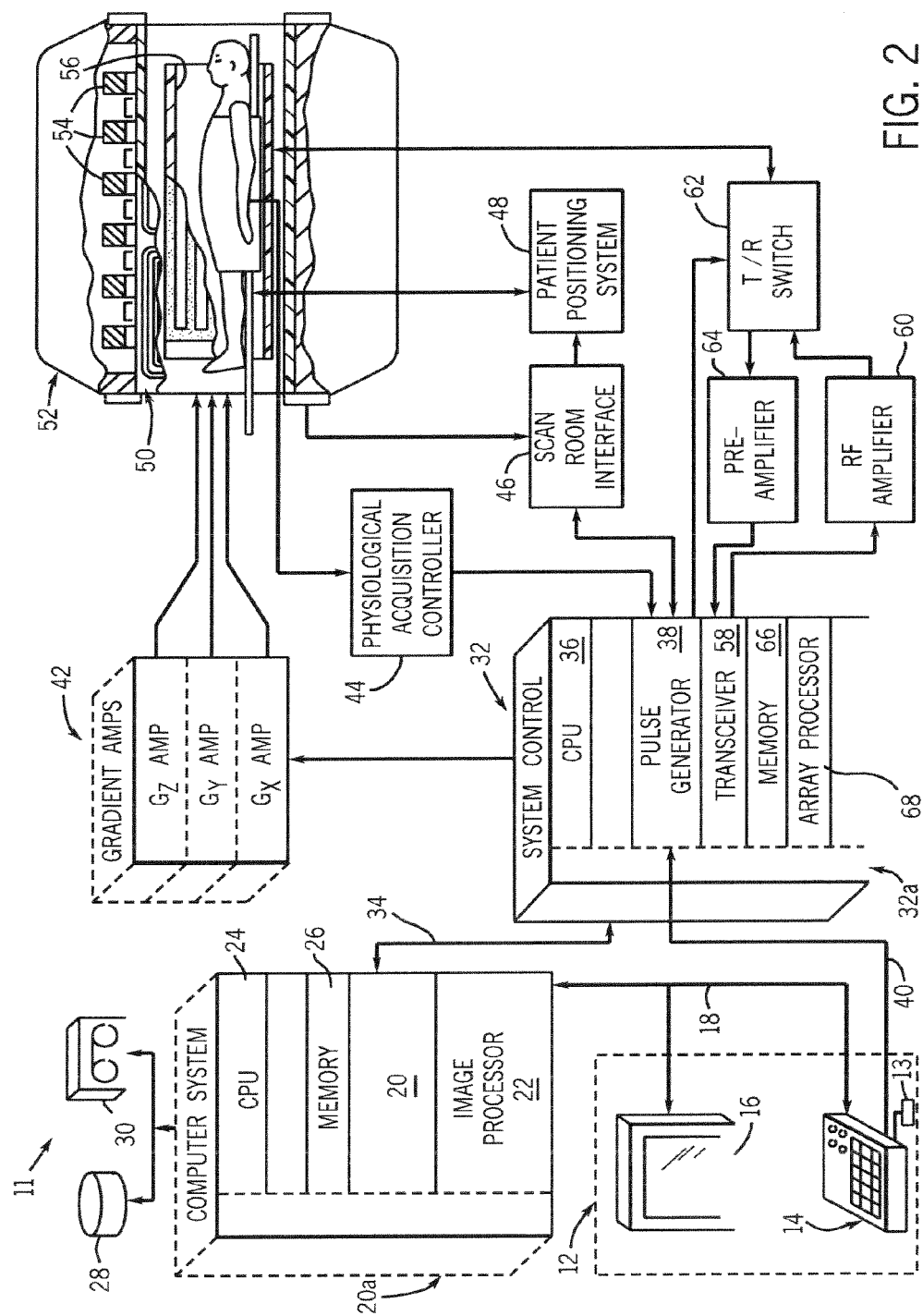
FIG. 2 is a schematic block diagram of an MR imaging system for use with the present invention.

Referring to FIG. 2, the major components of a preferred magnetic resonance imaging (MRI) system 11 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. One skilled in the art will appreciate that anatomically targeted coils such as head coils are also applicable with the illustrated MRI system 11. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

As will be described in greater detail below, the present invention is directed to an MR coil arrangement that reduces standing waves in cable shields connected to drive ports of the coil using balun networks. As a result, the efficiency of the coil is enhanced. Additionally, the coil arrangement includes a multi-point drive network whereupon circular polarization in the coil volume is maintained independent of patient or subject geometry or position. Maintaining of a circular polarized field is desirable as it has been shown that some circular polarized coils constructed as claimed can have twice the efficiency and forty percent better SNR than linear polarized coils.

Figure 3:
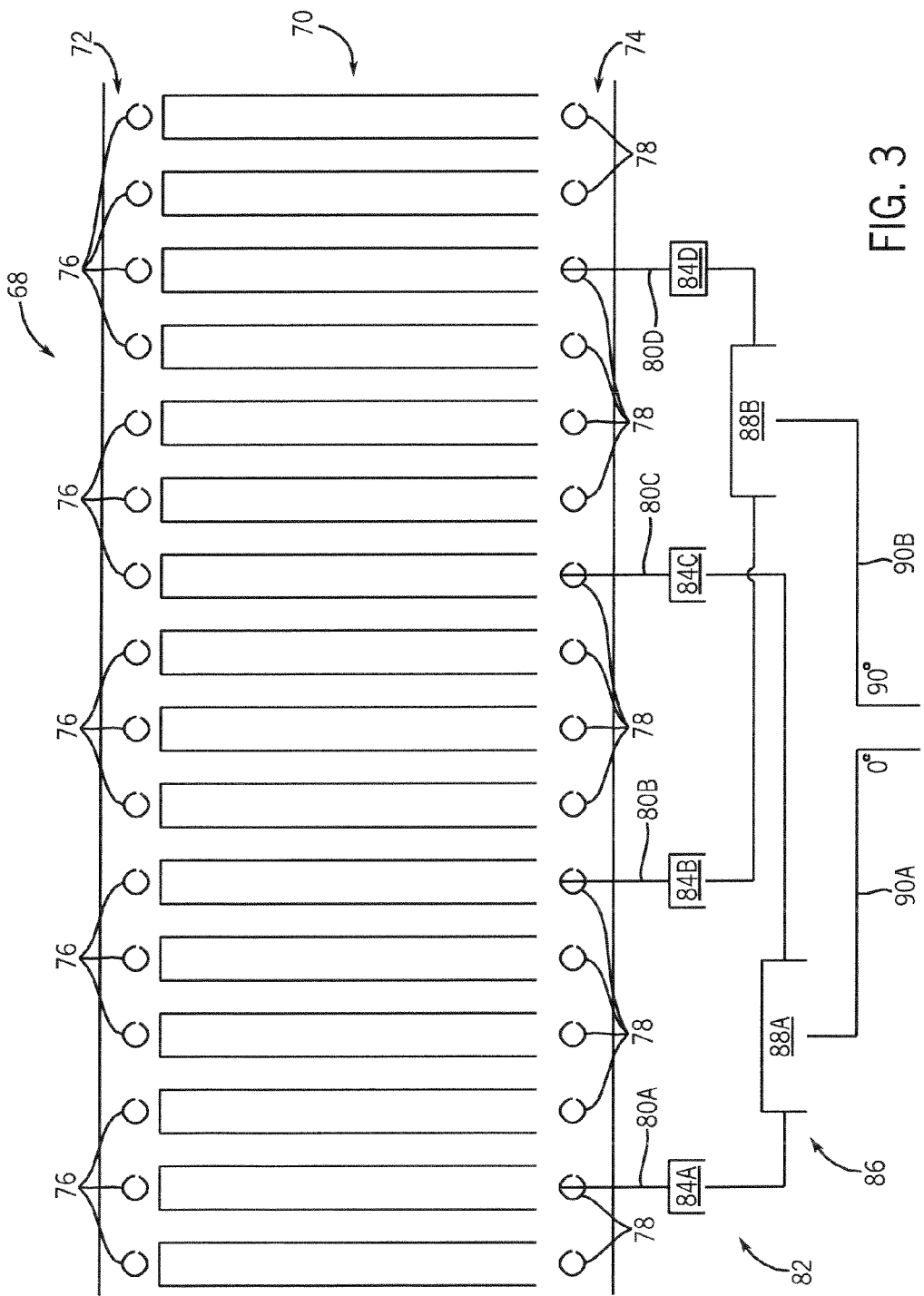
FIG. 3 is a schematic of an RF coil assembly in accordance with the present invention and applicable with the MR imaging system shown in FIG. 2.

Referring now to FIG. 3, a birdcage coil arrangement 68 is shown as having an exemplary sixteen coil elements 70. It should be noted that for purposes of illustration, the coil arrangement is being shown as a schematic representation of a plan view of an outstretched coil. That is, coil elements 70, in implementation, are collectively arranged in a cylindrical arrangement so as to form an imaging volume therein. Further, one skilled in the art will appreciate that fewer or more coil elements may be used depending on the field-of-view to be imaged. Coil 68 includes an inferior end-ring 72 and a superior end-ring 74. Associated with each coil element 70 is a pair of capacitors with one capacitor being connected at the inferior end-ring and the other capacitor being connected at the superior end-ring. As described above, coil 68 is designed to have a cylindrical shape and coil elements 70 are designed to generate a substantially circular polarized RF field in the interior volume of the coil when appropriately driven.

Coil 68 is driven through multiple drive ports 80. Further, in the illustrated example, coil 68 includes four drive ports 80. Each drive port 80 is designed to be driven at a voltage having a phase that is shifted from the phase of the voltage applied to a neighboring drive port. In a preferred embodiment, each of the drive ports is driven by a voltage with a phase that is shifted 90 degrees from the phase of the voltage applied to a neighboring drive port. For example, drive port 80A may have an applied voltage with a phase of zero degrees whereas the phase of the voltage applied to drive port 80B may then be 90 degrees. Further to the above example, the phases of the voltages applied to drive ports 80C and 80D may be 180 degrees and 270 degrees, respectively. The drive voltages are 90 degrees shifted in phase so as to set up a circular polarized field inside the interior volume of coil 68. Further, by implementing more than two drive ports, the asymmetry that typically results in a two drive port coil is greatly diminished. Therefore, with the coil design of the present invention, a substantially circular polarized RF field is maintained independent of patient asymmetry or field inequality or non-uniformity that results with subject contact with the coil when placed in the interior volume of the coil.

Coil 68 further includes a balun network 82 that includes a balun 84A–D for the drive ports 80A–D. More particularly, each drive port 80 is connected to a dedicated balun 84. Balun network 82 is constructed to eliminate standing waves that result from the voltage cables that would otherwise be directly connected to the drive ports 80A–D in a conventional birdcage coil.

Still referring to FIG. 3, each balun 84A–D is connected to receive an input from a splitter network 86. Each splitter 88A, 88B is constructed to receive a voltage input 90A and 90B, respectively, and split the phase of the voltage input. For example, each splitter 88A, 88B is designed to perform a 90 degree split of the phase of a voltage input 90A, 90B, respectively. Moreover, each splitter 88A, 88B is designed to not only split the single voltage input and provide two voltage outputs, it is also designed to perform a phase shift of 90 degrees. In this regard, splitter 88A, in one embodiment, will receive a voltage input with a phase of zero degrees and will provide two out-of-phase voltage outputs; one voltage output having a phase of 90 degrees and a second output having a phase of 270 degrees. On the other hand, splitter 88B will receive a voltage input having a phase of 90 degrees and will split that input into two out-of-phase voltage outputs. One voltage output having a phase of zero degrees and a second voltage output having a phase of 180 degrees. That is, each splitter performs a ±90 degrees phase shift of its input. The outputs of splitters 88A and 88B are then appropriately matched. As further shown in FIG. 3, the outputs of each splitter 88A, 88B are not input to neighboring baluns. Specifically, one output of splitter 88A is input to balun 84A whereas the other output splitter 88A is input to balun 84C. The outputs of splitter 88B are input to balun 84B and balun 84D, respectively.

Accordingly, the present invention is directed to an improved RF coil design and drive assembly that maintains a substantially circular polarized RF field independent of subject asymmetry or incidental subject contact with the coil itself. A balun network is integrated with the coil to kill standing waves that occur on the drive cables connecting drive ports of the coil to a power source. The drive cables are routed entirely along an outside of the coil volume. In addition, the coil is multi-point driven. That is, in a preferred embodiment, the coil is driven at four drive ports that are disposed along a common end ring of the coil. Each drive port is driven by a phase-shifted input such that the substantially circular polarized field is maintained.

The coil design of the present invention maintains quadrature isolation at a multitude of subject positions within the imaging volume. Additionally, the coil may be driven with less power than required of conventional coils without sacrificing SNR or image quality. Further, by maintaining a substantially circular polarized field, thermal uniformity is maintained across the imaging volume.

Therefore, in accordance with one embodiment of the present invention, an MR coil assembly is provided that includes a volume coil arrangement situated to generate a polarized field about a subject to be imaged. The coil assembly further includes multiple drive ports connected to a common end of the volume coil arrangement as well as multiple drive cables connected to a voltage source at one end and connected to the multiple drive ports at another end to apply voltages to the multiple drive ports. In this manner, the volume coil arrangement generates a substantially circular polarized field independent of subject asymmetry.

In accordance with another embodiment of the invention, an MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The RF coil assembly includes a plurality of RF coils arranged in a birdcage arrangement to acquire MR data from the subject at least partially positioned in a volume-of-interest. The coil assembly further includes a number of drive ports to receive an applied voltage to drive the plurality of RF coils to maintain a substantially circular polarized field about the volume-of-interest irrespective of possible subject contact with the RF coil assembly.

According to another embodiment, the present invention includes a method of driving coils of an MR coil assembly to maintain a polarized RF field independent of subject asymmetry. The method includes the steps of providing a pair of voltage inputs and splitting each voltage input into a pair of driving inputs. The method also includes the steps of inputting each driving input into a balun and inputting an output of each balun to a respective MR coil drive port of an MR coil assembly for generation of an RF field about a volume-of-interest.

The present invention has been described in terms of the preferred embodiment, and it is recognized that equivalents, alternatives, and modifications, aside from those expressly stated, are possible and within the scope of the appending claims.

What is claimed is:

1. An MR coil assembly comprising:
a volume coil arrangement situated to generate a polarized field about a subject to be imaged;
multiple drive ports connected to a common end of the volume coil arrangement; and
multiple drive cables connectable to a voltage source at one end and connected to the multiple drive ports at another end to apply voltages to the multiple drive ports such that the volume coil arrangement generates a substantially circular polarized field independent of subject asymmetry.

2. The assembly of claim 1 further comprising fewer drive cables than drive ports.

3. The assembly of claim 1 further comprising a balun connected to each drive port.

4. The assembly of claim 3 further comprising a splitter connected to each drive cable and a pair of baluns.

5. The assembly of claim 4 wherein each drive port is connected to receive a voltage that is 90 degrees out-of-phase from a voltage applied to a neighboring drive port.

6. The assembly of claim 1 wherein the common end of the volume coil arrangement is a superior end-ring of the volume coil arrangement.

7. The assembly of claim 1 wherein the volume coil arrangement includes sixteen coil elements arranged in a birdcage configuration.

8. The assembly of claim 2 wherein the multiple drive ports include four drive ports and the multiple drive cables include two drive cables.

9. The assembly of claim 1 wherein the volume coil arrangement is constructed such that a center thereof is not a virtual ground plane.

10. An MRI apparatus comprising:
a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR data from a subject, the RF coil assembly having:
a plurality of RF coils arranged in a birdcage arrangement to transmit RF energy toward the subject at least partially positioned in a volume-of-interest; and
a number of drive ports to receive an applied voltage to drive the plurality of RF coils and maintain a substantially circular polarized field about the volume-of-interest independent of subject contact with the RF coil assembly.

11. The MRI apparatus of claim 10 wherein the RF coil assembly includes a balun electiically connected to each drive port to couple balanced and unbalanced inputs.

12. The MRI apparatus of claim 11 further comprising at least one splitter, each splitter electrically connected to apply a phase-shifted voltage input to each balun of a pair of baluns.

13. The MRI apparatus of claim 12 further comprising a pair of voltage inputs, a first input electrically connected to a first splitter and a second input electrically connected to a second splitter.

14. The MRI apparatus of claim 13 wherein the first input is 90 degrees out-of-phase from the second input.

15. The MRI apparatus of claim 11 wherein each splitter is constructed to perform a ±90 degree phase shift of a voltage input.

16. The MRI apparatus of claim 10 wherein the birdcage arrangement includes an inferior end-ring and a superior end-ring, and wherein the number of drive ports are connected to only one of the inferior end-ring and the superior end-ring.

17. The MRI apparetus of claim 10 wherein a drive port is configured to be driven by an input that is 90 degrees out-of-phase of an input applied to a neighboring drive port.

18. The MRI apparatus of claim 10 wherein the RF coil assembly includes four drive ports and sixteen RF coil elements.

19. A method of driving coils of an MR coil assembly to reduce subject asymmetry input in a polarized RF field independent of subject asymmetry, the method comprising the steps of:
providing a pair of power inputs;
splitting each power input into a pair of driving inputs;
inputting each driving input to a balun; and
inputting an output of each balun to a respective MR coil drive port that is connected to more than one coil of an MR coil assembly for generation of an RF field about a volume-of-interest.

20. The method of claim 19 further comprising the step of splitting each input such that the driving inputs are shifted 90 degrees out-of-phase from one another.

21. The method of claim 19 further comprising the step of inputting a first driving input of a pair of driving inputs to a first balun and inputting a second driving input of the pair of driving inputs to a second balun, and wherein the first balun is electrically connected to a drive port that is not a neighbor of a drive port connected to the second balun.

22. The method of claim 19 further comprising the step of impedance matching the pair of voltage inputs before inputting the driving inputs to respective baluns.

23. The method of claim 19 wherein the RF coil assembly includes sixteen coils arranged in a birdcage coil arrangement, and wherein each RF coil assembly drive port is connected on a common end-ring.

* * * * *

UNITED STATES PATENT AND TRADEMARK OFFICE
CERTIFICATE OF CORRECTION

PATENT NO. : 7,088,100 B2 Page 1 of 1
APPLICATION NO. : 10/708567
DATED : August 8, 2006
INVENTOR(S) : Boskamp et al.

It is certified that error appears in the above-identified patent and that said Letters Patent is hereby corrected as shown below:

Col. 8, line 7 (Claim 11), delete "electiically" and substitute therefore -- electrically --; and
line 59 (Claim 23), delete "RF" and substitute therefore -- MR --.

Signed and Sealed this

Seventh Day of November, 2006

JON W. DUDAS
*Director of the United States Patent and Trademark Office*